(12) United States Patent
Grolier et al.

(10) Patent No.: US 8,247,259 B2
(45) Date of Patent: Aug. 21, 2012

(54) METHOD FOR THE PRODUCTION OF AN OPTOELECTRONIC COMPONENT USING THIN-FILM TECHNOLOGY

(75) Inventors: Vincent Grolier, München (DE); Andreas Plössl, Regensburg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 12/809,779

(22) PCT Filed: Nov. 21, 2008

(86) PCT No.: PCT/DE2008/001940
§ 371 (c)(1),
(2), (4) Date: Oct. 14, 2010

(87) PCT Pub. No.: WO2009/079969
PCT Pub. Date: Jul. 2, 2009

(65) Prior Publication Data
US 2011/0053308 A1    Mar. 3, 2011

(51) Int. Cl.
*H01L 21/00* (2006.01)
(52) U.S. Cl. ............ 438/67; 438/26; 438/68; 438/119; 438/464
(58) Field of Classification Search .......... 438/26, 438/39, 64–70, 118, 119, 464
See application file for complete search history.

(56) References Cited

U.S. PATENT DOCUMENTS

| 6,214,646 B1 * | 4/2001 | Baron ............................ 438/119 |
| 6,872,635 B2 | 3/2005 | Hayashi et al. |
| 7,402,910 B2 | 7/2008 | Bottner et al. |
| 7,642,639 B2 | 1/2010 | Huang et al. |
| 7,754,507 B2 | 7/2010 | Epler et al. |
| 2004/0209406 A1 | 10/2004 | Jan et al. |
| 2006/0180804 A1 * | 8/2006 | Stauss et al. ................ 257/11 |
| 2006/0189098 A1 | 8/2006 | Edmond |
| 2006/0234482 A1 | 10/2006 | Ploessl et al. |
| 2006/0289875 A1 | 12/2006 | Shieh et al. |
| 2007/0096130 A1 | 5/2007 | Schiaffino |
| 2008/0164467 A1 | 7/2008 | Sano et al. |
| 2009/0050920 A1 * | 2/2009 | Nakamura et al. ........... 257/99 |

(Continued)

FOREIGN PATENT DOCUMENTS

DE       195 31 158       2/1997

(Continued)

OTHER PUBLICATIONS

R. Schmid-Fetzer, "Fundamentals of Bonding by Isothermal Solidification for High Temperature Semiconductor Applications", Design Fundamentals of High Temperature Composites, Intermetallics, and Metal-Ceramic Systems, The Minerals, Metals & Materials Society, pp. 75-98, 1995.

*Primary Examiner* — Charles Garber
*Assistant Examiner* — Calvin Choi
(74) *Attorney, Agent, or Firm* — Cozen O'Connor

(57) ABSTRACT

On an epitaxy substrate (1), a layer structure (5, 6, 7) provided for light-emitting diodes or other optoelectronic components using thin-film technology is produced and provided with a first connecting layer (2), which comprises one or a plurality of solder materials. A second connecting layer (3) is applied over the whole area on a carrier (10) and permanently connected to the first connecting layer (2) by means of a soldering process.

14 Claims, 2 Drawing Sheets

U.S. PATENT DOCUMENTS

2009/0218591 A1    9/2009    Grolier et al.

FOREIGN PATENT DOCUMENTS

| | | |
|---|---|---|
| DE | 103 09 677 | 9/2004 |
| DE | 10 2004 016 697 | 9/2005 |
| DE | 10 2005 029 246 | 10/2006 |
| DE | 10 2005 048 408 | 12/2006 |
| DE | 10 2005 046 942 | 4/2007 |
| DE | 102 40 355 | 1/2008 |
| DE | 11 2006 002 083 | 6/2008 |
| DE | 10 2007 030 129 | 1/2009 |
| DE | 10 2008 050 538 | 2/2010 |
| EP | 0 905 797 | 3/1999 |
| EP | 1 768 193 | 3/2007 |
| TW | 311806 | 8/1995 |
| TW | 546721 | 8/2003 |
| TW | 2005 07120 | 2/2005 |
| TW | 2007 17862 | 5/2007 |
| TW | 2007 43198 | 11/2007 |
| WO | WO 2004/068567 | 8/2004 |
| WO | WO 2006/131087 | 12/2006 |
| WO | WO 2009/003442 | 1/2009 |
| WO | WO 2009/146689 | 12/2009 |

* cited by examiner

METHOD FOR THE PRODUCTION OF AN OPTOELECTRONIC COMPONENT USING THIN-FILM TECHNOLOGY

RELATED APPLICATIONS

This is a U.S. national stage of application No. PCT/DE2008/001940, filed on Nov. 21, 2008.

This patent application claims the priority of German patent applications 10 2007 061 471.5 filed Jun. 5, 2008 and 10 2008 026 839.9 filed Dec. 12, 2007, the disclosure content of both of which is hereby incorporated by reference.

FIELD OF THE INVENTION

The present invention relates to a method for transferring a thin-film structure of an optoelectronic component, in particular of a thin-film LED structure, from an epitaxy substrate to a carrier.

BACKGROUND OF THE INVENTION

During the production of thin-film LEDs (light-emitting diodes or luminous diodes using thin-film technology), the layer structure provided therefor is produced epitaxially on an epitaxy substrate. The epitaxy substrate is sapphire, for example, but can also be GaN, SiC, silicon, AlN or corresponding equivalent (for the growth of AlGaInN layer structures), GaAs, Ge or corresponding equivalent (for the growth of AlGaInP layer structures or AlGaAs layer structures) or InP (for the growth of InGaAsP layer structures). The thin-film LED structure is transferred to a carrier, e.g. composed of germanium, by connection contact areas of the LED structure, which are usually formed by a layer composed of Ti/Pt/Au, being soldered on a corresponding contact area of the carrier. The epitaxy substrate can subsequently be removed. The thin-film LED is then permanently fixed on the carrier and thus forms a component which can be mounted in an envisaged manner in a housing, by way of example.

A multiplicity of individual LEDs are produced on the epitaxy substrate. The layer structure of the thin-film LEDs therefore has to be subdivided into the individual LEDs. For this purpose, trenches are etched into the epitaxial layers, with the result that so-called mesas remain which are respectively assigned to an LED to be produced. In order to connect the connection contact areas of said mesas to the top side of the carrier, a solder layer is usually applied to the carrier over the whole area. During such a soldering process, solder material can be applied, in principle, to both contact areas to be connected to one another.

During soldering, the carrier and the epitaxy substrate are pressed onto one another with the contact areas facing one another. In this case, solder penetrates in an undesired manner into the trench between the mesas and forms irregular beads there. These irregularities during production cause losses in the yield of functional components and an increased outlay in the monitoring of mass production, which increases the manufacturing costs. These difficulties can be avoided e.g. by the mesas being etched only after connection to the carrier. Instead of this, it is also possible to structure the carrier in accordance with the LED mesas and, in this way, to keep the trench between the mesas free of solder; however, that requires an accurate alignment of the carrier on the epitaxy substrate.

Materials and methods of isothermal solidification which are suitable for the soldering of electronic components are described in detail in the article by Rainer Schmid-Fetzer: "Fundamentals of Bonding by Isothermal Solidification for High Temperature Semiconductor Applications" in R. Y. Lin et al. (eds.): "Design Fundamentals of High Temperature Composites, Intermetallics, and Metal-Ceramics Systems", The Minerals, Metals & Materials Society, 1995, pages 75 to 98.

DE 10 2007 030 129 specifies a method for producing a plurality of optoelectronic components. Said method comprises providing a connection carrier assemblage having a plurality of component regions, in each of which at least one electrical connection region is provided, and also providing a semiconductor body carrier, on which a plurality of separate semiconductor bodies connected to the semiconductor body carrier are arranged, wherein the semiconductor bodies each have a semiconductor layer sequence with an active region. The connection carrier assemblage and the semiconductor body carrier are oriented relative to one another in such a way that the semiconductor bodies face the component regions. A plurality of semiconductor bodies are mechanically connected to the connection carrier assemblage in a mounting region of a component region assigned to the respective semiconductor body, and the respective semiconductor body is electrically conductively connected to the connection region of the component region assigned to the semiconductor body. The semiconductor body connected to the connection carrier assemblage is separated from the semiconductor body carrier, and the connection carrier assemblage is divided into a plurality of separate optoelectronic components each having a connection carrier, which has the component region, and a semiconductor body arranged on the connection carrier and electrically conductively connected to the connection region.

SUMMARY OF THE INVENTION

It is an object of the present invention to specify an improved method for transferring the epitaxial layers provided for thin-film LEDs or other optoelectronic components produced using thin-film technology to a carrier.

During this production method, a solder composed of one or a plurality of solder materials is applied on the mesa structure of the components, for example the LEDs, and a contact coating is applied on a carrier. After the production of a solder connection between the solder material and the material of the contact coating, the mesa structure is fixed permanently and, if appropriate, electrically conductively on the connection contact area of the carrier, such that the components have been transferred to the carrier. In this case, a solder material should be understood to mean a material which, below an upper limit temperature that is still permissible for the semiconductor material, can be melted and alloyed into a contact material which has a higher melting point (i.e. which melts at a higher temperature).

In the soldering process, a component having a low melting point is used as solder material and a component having a high melting point is used as contact coating. The soldering can be eutectic bonding without increasing the melting point after the joining process or isothermal solidification. After soldering by means of isothermal solidification, the alloy thus produced has a higher melting point than the components of the solder connection. An appropriate component having a low melting point is, by way of example, pure tin, pure indium or pure gallium, but also eutectic mixtures such as, for example, gold and tin in a percent by weight ratio of 80:20. A eutectic composition of the materials results in a significant lowering of the melting temperature, such that the process temperature can remain as far as possible below the melting temperature of the individual components.

Vapor deposition of the solder material (PVD, physical vapor deposition) permits the use of a lift-off process for structuring the solder layer and the mesas of the LEDs, without the solubility of a resist used being impaired by excessively high process temperatures. Consequently, even platinum-containing layers can be structured with good quality. Instead of a homogeneous alloy, a layer sequence which forms a mixture of the materials during the solder process can preferably be applied as solder material.

BRIEF DESCRIPTION OF THE DRAWINGS

Examples of the method will be described in greater detail below with reference to the accompanying figures.

DETAILED DESCRIPTION OF THE DRAWINGS

Figure 1:
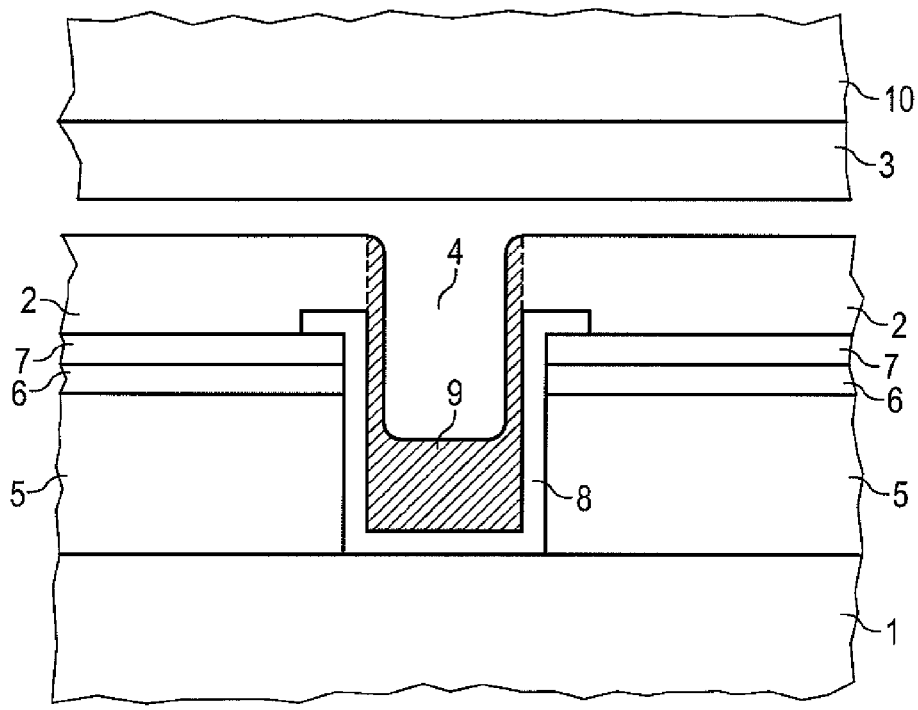
FIG. 1 shows an arrangement of an epitaxy substrate and a carrier with layers applied thereon in cross section.

FIG. 1 shows in cross section a substrate 1 with a layer—produced thereon, in particular grown epitaxially thereon—of an optoelectronic semiconductor component produced using thin-film technology, such as, for example, a thin-film LED, thin-film IRED or thin-film laser diode, for which reason the substrate 1 is referred to hereinafter as epitaxy substrate in order to differentiate it from the carrier. The epitaxy substrate 1 is e.g. sapphire, GaN, SiC, silicon, AlN, GaAs, Ge or InP. Situated thereon is a semiconductor layer 5, which forms the essential semiconductor portion of the component and is GaN, for example, which is used in particular for blue emitting thin-film LEDs. A mirror layer 6 is usually provided in order to reflect the generated light in the direction provided for coupling out, and can be metallic (and comprise for example Ag, Al or Au), dielectric (for example $SiO_x$, $SiN_x$ or the like), metallic and dielectric (combined and provided with a lateral structuring, for example), or else be produced with TCO (transparent conductive oxide). A barrier layer 7 should be applied thereon, which barrier layer prevents a vertical intermixing of the layer stack and can be Ti/Pt/Au, for example, or can comprise molybdenum, TiN, TiW(N) or the like. This layer structure is structured by means of trenches into a multiplicity of mesas, each of which forms a component, a thin-film LED in this example. Portions of two mesas are illustrated on the left and right in FIG. 1. Interspaces 4 formed by the etched trenches are present between the mesas. The sidewalls of the mesas can be provided with a passivation layer 8, e.g. composed of $SiN_x$.

A first connecting layer 2 is applied to this structure, which first connecting layer comprises one or a plurality of solder materials in the method according to the invention. A carrier 10, which can be germanium, for example, is provided with a second connecting layer 3 over the whole area. Said second connecting layer 3 is provided as a solder contact coating and can be Ti/Pt/Au, for example. The epitaxy substrate 1 and the carrier 10 are oriented relative to one another in the manner illustrated such that the first connecting layer 2 and the second connecting layer 3 are arranged in a manner lying opposite one another. The connecting layers are then pressed onto one another and are connected to one another permanently, and if appropriate electrically conductively, by the production of the solder connection. The materials of the connecting layers can be chosen to be electrically conductive for this purpose; moreover, the materials are preferably intended to be thermally conductive.

Figure 2:
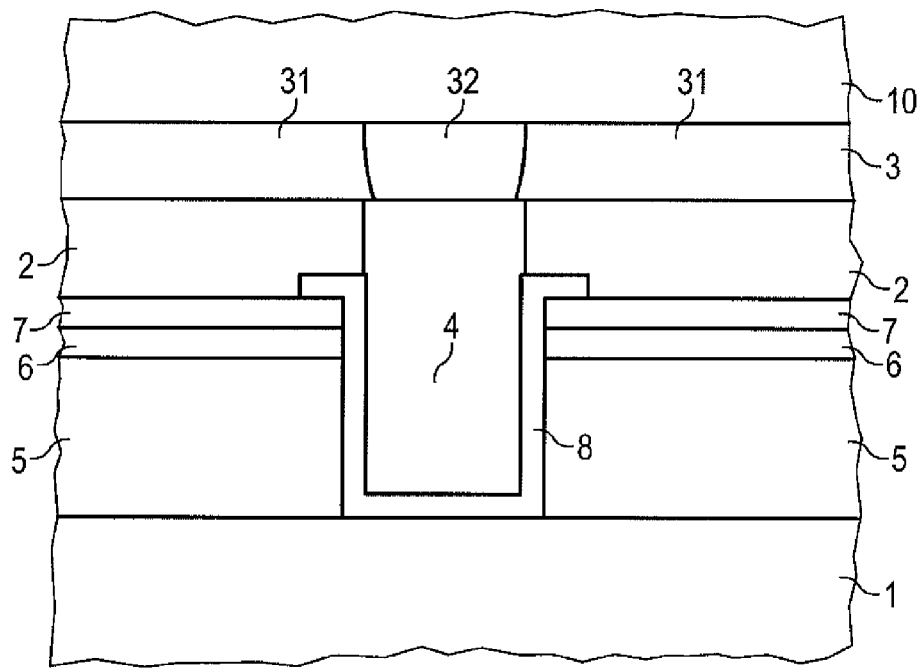
FIG. 2 shows the arrangement in accordance with FIG. 1 in cross section after the components have been joined together.

FIG. 2 shows the arrangement in accordance with FIG. 1 after the first connecting layer 2 and the second connecting layer 3 have been connected. From the solder material of the first connecting layer 2 and the contact material of the second connecting layer 3, a third connecting layer 31 is in each case formed in the regions above the mesas, while a residual portion 32 of the second connecting layer 3 remains above the interspaces 4. In the third connecting layer 31, the solder material of the first connecting layer 2 is alloyed into the contact material of the second connecting layer 3. The epitaxy substrate 1 can then be removed and the LEDs can be singulated and processed further in the usual way.

Further descriptions of a series of exemplary embodiments follow.

One embodiment of the first connecting layer 2 provides a layer sequence comprising the materials titanium, platinum, tin, titanium and gold successively on the barrier layer. In this example, the second connecting layer 3 is Ti/Pt/Au. The proportions of gold and tin are preferably chosen such that an 80/20 eutectic composed of $\zeta$-$(Au_5Sn)$+$\delta$-AuSn is formed during the soldering process (Au and Sn approximately in a percent by weight ratio of 80:20). For this purpose, by way of example, 50 nm titanium, 100 nm platinum, 1000 nm tin, 10 nm titanium and, finally, 100 nm gold can be applied to the barrier layer 7 of the LED and be structured in accordance with the LED mesas by means of etching or using lift-off technology. In this embodiment, therefore, approximately the portion 9 of the first connecting layer 2 as depicted in hatched fashion in FIG. 1 is removed. By way of example, 100 nm titanium, 100 nm platinum and, finally, 1400 nm gold are applied as second connecting layer 3 on the carrier 10. The principal portions in this example, namely the tin on the LED structure and the gold on the carrier, form the envisaged eutectic in the soldering process, said eutectic having a significantly lower melting point than its components. Instead of (preferably eutectic) mixture of gold and tin, it is also possible to provide a mixture of lead and tin, bismuth and tin, indium and tin or other metals together with tin.

In order to achieve a sufficiently good barrier between the metals of the mirror layer 6 and the first connecting layer 2, molybdenum can additionally be provided in the barrier layer 7, for example, said molybdenum forming with gold and tin a ternary phase equilibrium. Instead of this, a barrier composed of Ti:N, TiW:N or the like can be provided in the barrier layer 7. In the exemplary embodiment described, tin is used as an essential constituent of the solder material. However, the invention is not restricted to the use of a tin-containing connecting layer, as will be shown by the exemplary embodiments described below.

A further exemplary embodiment uses, as first connecting layer 2, a bismuth layer covered with a thin Ti/Au layer or Au layer. The bismuth can be structured by etching using hot sulfuric acid or 5% strength silver nitrate solution. One possible layer construction is, by way of example, 100 nm titanium/1000 nm bismuth/100 nm gold as first connecting layer 2 and 50 nm platinum/200 nm TiW:N/1000 nm gold as second connecting layer 3.

In a further exemplary embodiment, a sufficiently thick first connecting layer 2 composed of gold is applied and a carrier 10 composed of germanium with a thin second connecting layer 3 composed of gold is used for forming a gold-germanium eutectic. The carrier 10 can be a germanium wafer or only comprise a layer of germanium. Silicon can be used instead of germanium. In this case, too, it is possible to use a silicon wafer as carrier 10 or a carrier having a sufficiently thick silicon layer. With the use of germanium, by way of example, a layer sequence comprising 100 nm titanium, 100 nm platinum and 1000 nm gold would be applied as first connecting layer 2. The second connecting layer 3 on the carrier would be e.g. a layer of 50 nm gold. In the case of a silicon carrier, by way of example, approximately 100 nm gold would be applied on the silicon as second connecting layer 3 and a layer sequence comprising 100 nm titanium, 100 nm platinum and 2000 nm gold would be produced as first connecting layer 2.

A lift-off technique for structuring the first connecting layer 2 in accordance with the LED mesas can be dispensed with if the method is modified e.g. as follows. By way of example, a layer sequence composed of TiW:N, platinum and gold could be provided as barrier layer 7. A suitable wetting layer comprising e.g. 50 nm platinum and 50 nm gold thereon can preferably be applied thereon. The interspaces 4 are then etched as trenches in order to form the mesas of the LEDs. The mesa sidewalls are provided with a passivation layer 8, e.g. composed of $SiN_x$.

The first connecting layer 2 is then formed by tin being applied over the whole area with a thickness of typically approximately 800 nm. This layer is covered with 10 nm titanium and 100 nm gold thereon as protection against diffusion and oxidation of the tin. The carrier can be germanium, for example, which is preferably provided with a barrier layer on the top side. Gold is applied as second connecting layer 3, e.g. with a typical thickness of approximately 1060 nm.

During soldering, the tin layer melts and withdraws from the surfaces of the passivation layer 8 onto the Au/Pt-containing layers or forms beads on the passivation layer 8, which beads can subsequently be etched away e.g. using $FeCl_3$ solution or using $HNO_3/C_2H_5OH$ (1:49). A type of self-alignment of the first connecting layer 2 on the barrier layer 7 is thus effected, such that the removal of the portions 9 highlighted in hatched fashion in FIG. 1 can be obviated.

Other silicon-containing compounds, such as e.g. $SiO_x$, $SiNO_x$, SiC or the like, are also appropriate as passivation layer 8. The material of the passivation layer 8 is chosen for this exemplary embodiment such that it is not wetted by tin or a tin-containing melt. A reactive soldering process, as in the example with tin, gold and platinum, enables the solder beads that form on the passivation layer 8 to be etched away selectively with respect to the solder material which has reacted chemically.

The specified ratios of the components of the solder material and the layer thicknesses can be varied in the context of the invention. In particular, the formation of a binary eutectic can be varied, thus e.g. in the system of gold and tin, e.g. by providing the $\zeta$-$(Au_5Sn)$ phase as the main constituent of the solder. In this exemplary embodiment, a higher Au:Sn ratio would be chosen and the thickness of the gold layer on the carrier would be chosen e.g. typically as approximately 2900 nm.

It is not necessary to provide all the mesas that are present with solder material for a first connecting layer all at once. Instead, it is also possible to transfer step by step in each case only a selection of the mesas to a carrier by soldering, for example only every second mesa in each series of mesas. The layers of the relevant components are detached from the epitaxy substrate after the subdivision of the carrier, while the rest of the components still remain as mesas composed of epitaxial layers on the epitaxy substrate. A further carrier with a further second connecting layer is then used and a soldering process is once again carried out, such that a wider selection of components, for example even all the remaining components, are transferred from the epitaxy substrate to a carrier. The transfer process can be carried out, if appropriate, in a plurality of steps using a plurality of carriers, wherein it is always the case that only a specific proportion of the components is transferred. The mesas can be detached from the epitaxy substrate by means of laser radiation, for example, which, particularly in the production of GaN diodes, enables locally delimited detachment of a GaN layer from the epitaxy substrate. The production methods from the prior art as indicated in the introduction can be used analogously in this method step.

Figure 3:
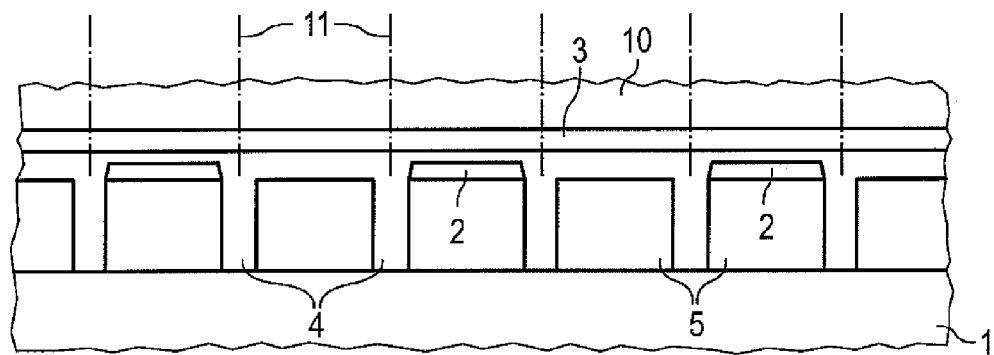
FIG. 3 shows an arrangement in accordance with FIG. 1 for a further exemplary embodiment in cross section.

An exemplary embodiment of such a method will be described with reference to FIGS. 3 to 5, which each illustrate modified arrangements in accordance with FIGS. 1 and 2 in cross section. FIG. 3 illustrates an arrangement of a semiconductor layer 5 on an epitaxy substrate 1, said semiconductor layer being subdivided into mesas by interspaces 4. Every second mesa of the series of mesas which can be seen in the cross section has been provided with a first connecting layer 2 composed of one or a plurality of solder materials. These mesas are soldered with a second connecting layer on a carrier. The semiconductor layer 5 can be provided for example for the production of UV luminescence diodes (UV LEDs) and be AlGaN, grown epitaxially on a substrate 1 composed of AlN. After the application of an electrical contact coating and optical mirror coating, a barrier layer is applied, which can be carried out as in conventional methods and is not illustrated in FIG. 3. The mesas can be subdivided photolithographically; the interspaces 4 can be produced by trench etching. The first connecting layer 2, having a relatively low melting point, can in this case be 50 nm Ti/2000 nm Bi/150 nm Au, for example, and the second connecting layer 3 composed of the contact material having a higher melting point can be 400 nm TiW/2000 nm Au, for example, over the whole area. After soldering, the carrier 10 is subdivided at the locations marked by the dash-dotted cutting lines 11 in FIG. 3, and the soldered components are detached from the epitaxy substrate 1. This can be done by means of a selective laser lift-off method by which the semiconductor layer 5 of the relevant components is in each case lifted off from the epitaxy substrate 1.

Figure 4:
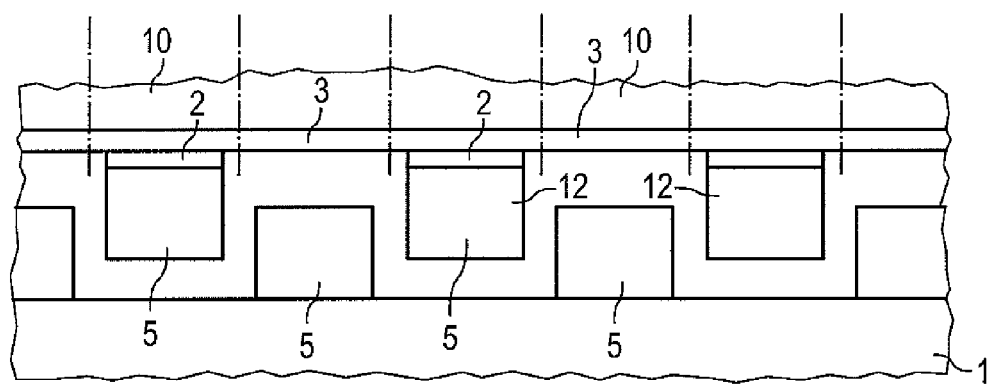
FIG. 4 shows a cross section in accordance with FIG. 3 after the detachment of a portion of the soldered components.

FIG. 4 shows the arrangement after the lift-off of the soldered components 12. It can be discerned in this cross section that the components which have not yet been soldered remain as mesas on the epitaxy substrate 1 and are thus held in an assemblage with the epitaxy substrate 1. The remaining mesas can likewise be transferred to carriers in further method steps.

Figure 5:
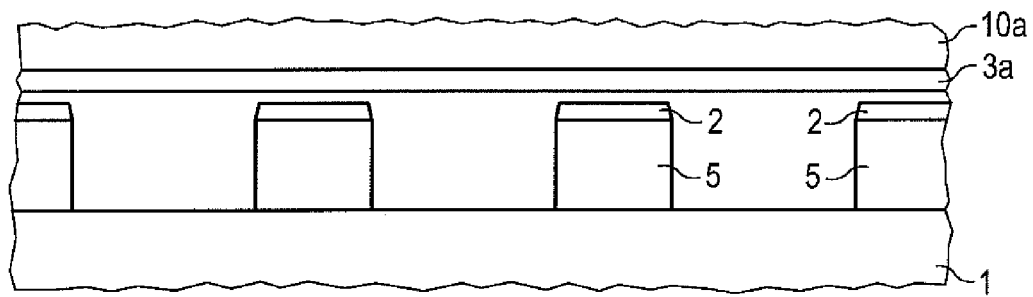
FIG. 5 shows a cross section in accordance with FIG. 4 with an arrangement of a further carrier.

FIG. 5 shows an arrangement comprising the epitaxy substrate 1 with the residual portions of the semiconductor layer 5, which have now been provided with a further first connecting layer 2 composed of solder material having a relatively low melting point. In order to transfer these components, too, a further carrier 10a with a further second connecting layer 3a composed of a contact material having a higher melting point is used. The remaining method steps correspond, from this point on, to the exemplary embodiment described above.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. A method for producing an optoelectronic component using thin-film technology, wherein:
 a layer structure provided for an optoelectronic component is produced on an epitaxy substrate,
 the layer structure is structured to form mesas in accordance with an envisaged division into individual components,
 a first connecting layer is applied on top sides of the mesas,
 a second connecting layer is applied on a carrier,
 the first connecting layer and the second connecting layer are brought into contact with one another and permanently connected to one another, and
 the epitaxy substrate is removed,
 wherein the first connecting layer comprises one solder material or a plurality of solder materials, and
 wherein the first connecting layer is produced only on a selection of the mesas, and after the first connecting layer and the second connecting layer have been connected to one another, only the mesas thus connected are removed from the epitaxy substrate.

2. The method as claimed in claim 1, wherein the second connecting layer comprises a material having a higher melting point by comparison with the solder material.

3. The method as claimed in claim 1, wherein the solder material is a eutectic mixture.

4. The method as claimed in claim 1, wherein the first connecting layer is structured by means of a lift-off technique in accordance with the mesas.

5. The method as claimed in claim 1, wherein the first connecting layer comprises tin.

6. The method as claimed in claim 5, wherein the first connecting layer comprises gold and tin.

7. The method as claimed in claim 1, wherein the first connecting layer comprises gold and bismuth.

8. The method as claimed in claim 1, wherein the carrier is germanium, and the first connecting layer and the second connecting layer comprise gold.

9. The method as claimed in claim 1, wherein the carrier is silicon, and the first connecting layer and the second connecting layer comprise gold.

10. The method as claimed in claim 1, wherein the first connecting layer is applied on a barrier layer, and wherein the barrier layer contains Ti or TiW.

11. The method as claimed in claim 1, wherein the second connecting layer comprises Ti/Pt/Au.

12. The method as claimed in claim 1, wherein sidewalls of the mesas are covered with a silicon-containing passivation layer.

13. The method as claimed in claim 1, wherein the totality of the mesas that have remained on the epitaxy substrate or a further selection of the mesas that have remained on the epitaxy substrate is subsequently provided with the first connecting layer and transferred to a further carrier provided with a further second connecting layer.

14. The method as claimed in claim 1, wherein the mesas transferred to a carrier are detached from the epitaxy substrate by a laser lift-off method.

* * * * *